United States Patent [19]

Tsang

[11] Patent Number: 4,666,555

[45] Date of Patent: May 19, 1987

[54] PLASMA ETCHING OF SILICON USING FLUORINATED GAS MIXTURES

[75] Inventor: Chi-Hwa Tsang, Beaverton, Oreg.

[73] Assignee: Intel Corporation, Santa Clara, Calif.

[21] Appl. No.: 768,875

[22] Filed: Aug. 23, 1985

[51] Int. Cl.$^4$ .................. H01L 21/306; B44C 1/22; C03C 15/00; C03C 25/06

[52] U.S. Cl. ..................... 156/643; 156/646; 156/657; 156/659.1; 156/662; 204/192.37; 252/79.1

[58] Field of Search ............ 156/643, 646, 657, 659.1, 156/662; 204/164, 192 E; 427/38, 39; 252/79.1

[56] References Cited

U.S. PATENT DOCUMENTS 4,601,782 7/1986 Bianchi et al. ..................... 156/643

OTHER PUBLICATIONS

E. C. Whitcomb, Selective, Anisotropic, Etching of $SiO_2$ and PSG in a $CHF_3/SF_6$, RIE Plasma, Conference: Electrochemical Society Inc., Spring Meeting, May 9-14, 1982, Montreal, Canada, Abstract No. 211, pp. 339-340.

Primary Examiner—William A. Powell
Attorney, Agent, or Firm—Blakely, Sokoloff, Taylor & Zafman

[57] ABSTRACT

A method of plasma etching silicon using a fluorinated gas mixture. A mixture of $CHF_3$ and $SF_6$ is utilized in an etch chamber to form a plasma for etching silicon. The degree of anisotropy of the etch can be controlled by changing the percentage of $CHF_3$ in the $CHF_3/SF_6$ mixture. The method does not adversely affect the etched surface so that no post-etch thermal process step is required to cure the silicon surface.

8 Claims, 6 Drawing Figures

PLASMA ETCHING OF SILICON USING FLUORINATED GAS MIXTURES

BACKGROUND OF THE INVENTION

1. Field of the Invention

This invention relates to the field of plasma etching of silicon, particularly in the fabrication of semiconductor devices.

2. Prior Art

In the fabrication of semiconductor devices using monocrystalline silicon substrates, it is often desired to etch certain areas of the silicon substrate, particularly when manufacturing high packing density integrated circuit chips. In the prior art this has been accomplished by the use of plasma etching. In the plasma etching process, the silicon is first coated with a layer of photoresist. Openings are formed in the photoresist to expose selected areas of the underlying silicon. The silicon is then placed in an etch chamber. The chamber, which is a controlled environment, includes means for introducing gas to the chamber and electrodes for producing plasma from the gas. Typically chlorinated gases such as $Cl_2$, $CCl_4$, etc. are used to form plasmas to etch the silicon. The gas is introduced to the chamber and RF energy is applied to produce the plasma. Etching takes place until the RF energy is removed, with the timing of the process, pressure, RF energy and flow rate controlling the depth of etching.

There are several disadvantages with etching silicon by the prior art methods. First, the chlorinated gases used are highly hazardous to human life. For example, carbon tetrachloride, $CCl_4$, is toxic to humans and has a permissible exposure rate of only 10 parts per million (ppm). At levels above 300 ppm, there is an immediate threat to human life. In addition, $CCl_4$ is a suspected carcinogen. By itself, chlorine ($Cl_2$) is toxic and corrosive with a permissible exposure limit as defined by the Occupational Safety and Health Administration (OSHA) of only 1 ppm. Immediate danger to life begins at 25 ppm. As a result, expensive precautions must be taken to prevent leaks of the gas which could endanger human life. These precautions add to the expense of the etching process.

Secondly, the chlorine gas is highly corrosive, resulting in shorter lifetimes of components exposed to the gas.

Third, during the etching process of the silicon, the chlorine gas damages the surface of the silicon, leaving it rough. As a result, the formation of oxide layers is adversely affected. This leads to undependable device characteristics. This damage can be cured, but only with an additional thermal step.

Finally, the chlorine gas can etch the silicon isotropically, undercutting the photoresist layer and requiring larger design windows to obtain acceptable devices.

Therefore, it is an object of the present invention to provide a method of etching silicon which does not involve hazardous materials.

It is a further object of the present invention to provide a method of etching silicon which does not use corrosive materials.

Yet another object of the present invention is a method of etching silicon which does not damage the surface of the silicon.

A still further object of the present invention is a method of etching silicon anisotropically to eliminate undercutting of the photoresist layer.

SUMMARY OF THE PRESENT INVENTION

The present invention utilizes a fluorinated gas mixture to form a plasma to etch silicon. The gas mixture is comprised of $CHF_3$ and $SF_6$, which is non-toxic to humans and noncorrosive. When a mixture of 80% $CHF_3$ and 20% $SF_6$ is utilized to form the plasma, substantially anisotropic etching of the silicon results, eliminating undercutting of the photoresist layer. The fluorinated gas mixture does not harm the surface of the silicon so that subsequent oxidation steps are not affected by the etching. No thermal step is required to cure the damage of the etch.

DETAILED DESCRIPTION OF THE PRESENT INVENTION

An improved method for the plasma etching of silicon is described. Fluorinated gases are utilized to provide anisotropic etching. In the following description, numerous specific details are set forth such as gas percentages, RF power, etc. in order to provide a more thorough understanding of the present invention. It will be obvious, however, to one skilled in the art, that the present invention may be practiced without these specific details. In other instances, well-known processes have not been described in detail in order not to unnecessarily obscure the present invention.

In plasma etching, a silicon wafer is placed in an etch chamber. One such type chamber is a parallel plate reactor. In such a reactor, upper and lower flat electrodes are disposed horizontally and parallel to each other. The upper electrode is usually the "power" electrode and is coupled to an RF generator. Gases enter through a "shower head" type upper electrode, which is coupled to an RF generator. Silicon wafers are placed on the lower electrode in the chamber, gases enter the chamber and RF energy is used to create plasma to perform the etching.

Figure 1:
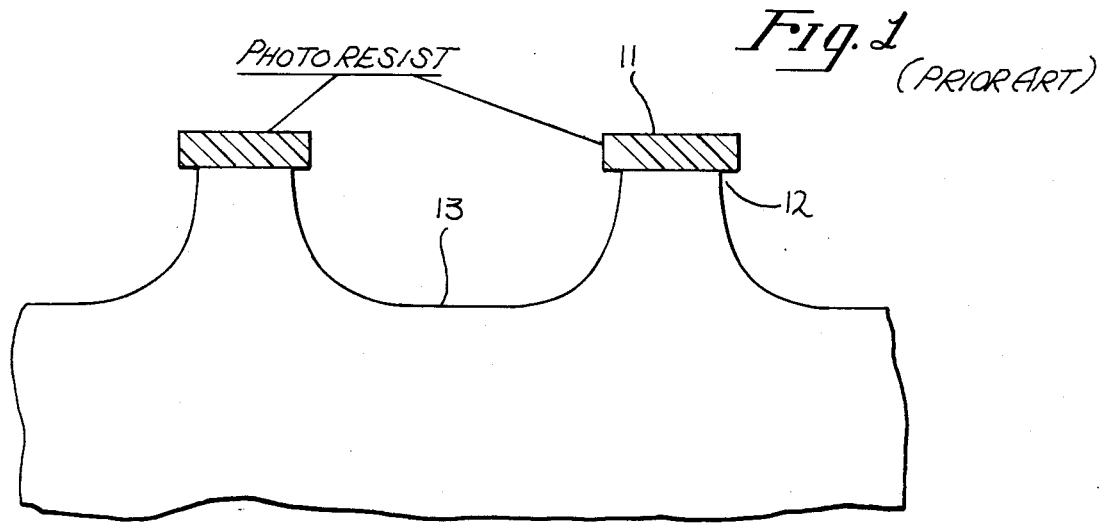
FIG. 1 illustrates a cross-sectional view of silicon etched by prior art methods.

When etching silicon, photoresist masks are utilized to define the etch pattern. However, because of an isotropic etching undercutting of the photoresist layer results. An example of this is shown in FIG. 1. An etch pattern has been formed in the silicon layer 10 defined by photoresist mask 11. As can be seen in FIG. 1, the sidewalls of the etched area extend beneath the photoresist layer resulting in overhang 12. Due to this phenomenon, the design window for etch patterns using this method must be larger to accomplish a desired etch. This limits the degree of density which can be achieved in circuit design. The current state of the art allows patterns to be formed in photoresist layers of one micron width. However, because of isotropic etching, the minimum width of the etched opening is currently limited to 1.5 to 2 microns.

One prior art attempt to reduce the isotropy of plasma etching is described in "Plasma Etching Using SF6 and Chlorine Gases". M. Mieth and A. Barker, Semiconductor International, May 1984, pages 222-227. There, SF6 combined with CHCL3 and SF6 combined with pure chlorine were found to result in partially anisotropic etching. However, this method has the problem of toxicity, corrosive effect on equipment, the need for expensive chlorine detectors in the process area and the need for stainless steel pipes and tubes for gas transport.

Additionally, chlorinated gases used for plasma etching harm the surface of the etched silicon such as at region 13 of FIG. 1. See, for example, "Reactive Ion Etching of Silicon" Schwartz and Schaible, *Journal of Vacuum Science and Technology*, March/April 1979 pp. 410-413, and "Study of Breakdown Fields of Oxides Grown or Reactive Ion Etched Silicon Surface: Improvement of Breakdown Limits by Oxidation of the Surface" Lifshitz, *Journal of the Electrochemical Society: Solid State Science and Technology*, July, 1983, pp. 1549-50.

After etching, the silicon surface contains pores and spikes and severe microroughness. Subsequently grown oxide layers suffer from high field failure rates. One solution to this problem is the growth of several "sacrifical" thermally grown oxide layers which are then removed. This method involves additional thermal steps which can be avoided by utilizing the method of the present invention.

PREFERRED EMBODIMENT

The preferred embodiment of the present invention utilizes a combination of SF6 and CHF3 to perform plasma etching of silicon. Fluorine gases are not toxic and are non-corrosive, eliminating the need for gas detectors in the process area. Additionally, copper or plastic tubing could be used to transport the gas if desired.

Figure 2:
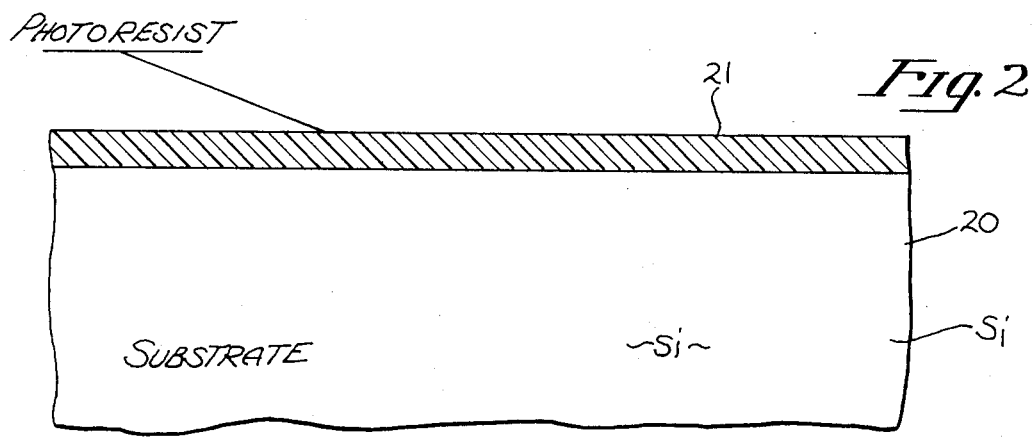
FIG. 2 illustrates a silicon body having a layer of photoresist formed thereon.
Figure 3:
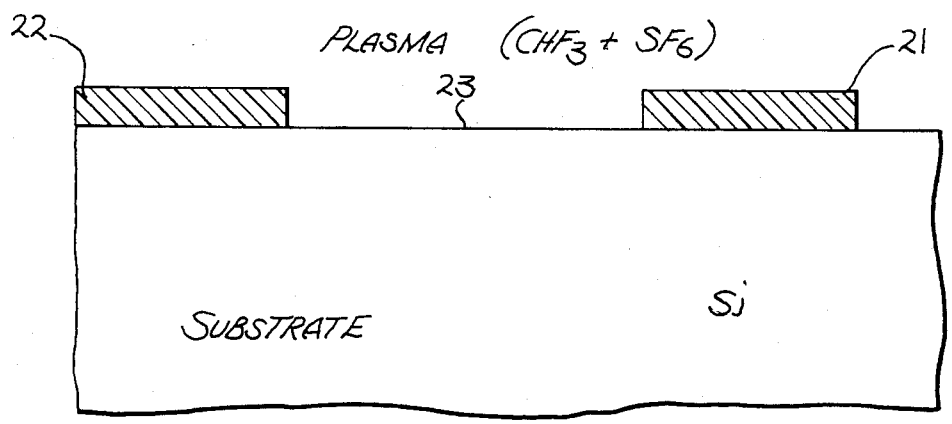
FIG. 3 illustrates the body of FIG. 2 after openings have been formed in the photoresist.
Figure 4:
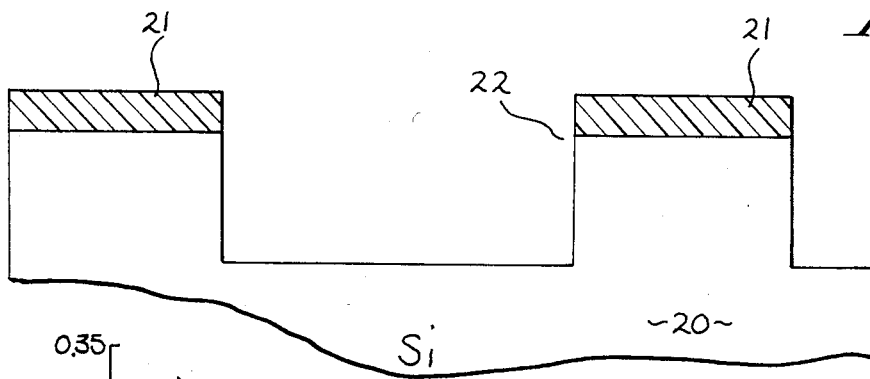
FIG. 4 illustrates the body of FIG. 3 after etching.

The method of the present invention is illustrated in FIGS. 2 through 4. In FIG. 2, a layer of photoresist 21 is formed on a silicon body 20. Next, as shown in FIG. 3, opening 23 is defined in the photoresist layer using well-known photolithographic methods. The CHF3 and SF6 combination is introduced to the etch chamber and RF power is applied to create a plasma. The pressure of the chamber, as well as the flow rate of the gas, is controlled, and the silicon is etched to the desired depth. As shown in FIG. 4, substantially anisotropic etching of the silicon 20 has taken place. As shown in area 22, the sidewall of the etch opening is flush with the photoresist mask 21. As a result, the limit of design density is limited only by the design limits of the photoresist mask.

Figure 6:
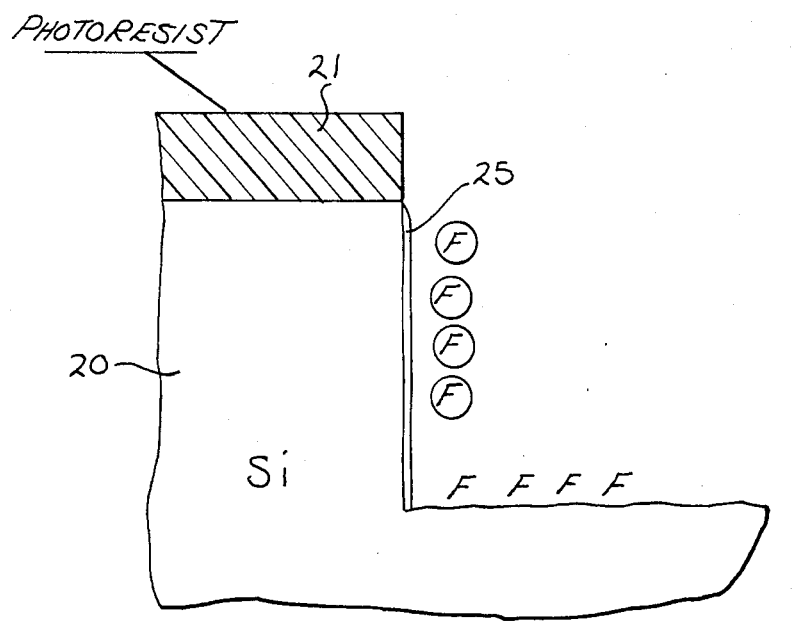
FIG. 6 illustrates the action of polymer precursors.

The anisotropic action of the present invention is believed to result from the formation of a polymer on the sidewalls of the etched opening during the etch step. The CHF3 is broken up in the plasma to CF2, CF3 and CHF, which act as polymer precursors to form a polymer layer on the sidewalls of the etch opening. This process is shown in greater detail in FIG. 6. Fluorine is prevented from being adsorbed into the sidewalls by the polymer coating 25 formed by the polymer precursors. As a result, the etch becomes anisotropic, extending into the silicon in alignment with the mask pattern. The polymer layer 25 does not form on the bottom of the etch opening due to ion bombardment, allowing the fluorine to be adsorbed onto the silicon. The etching occurs as a result of this adsorption of flourine onto the silicon layer.

In addition to the advantages in health and safety obtained by use of the present invention, the method has the further advantage of not harming the surface of the etched layer of silicon. As a result, subsequent thermal oxidation steps and corresponding oxide removal steps are eliminated when utilizing the present invention.

In the preferred embodiment of the present invention, a gas mixture including approximately 80% CHF3 and approximately 20% SF6 is utilized. The flow rate of the gas is approximately 125 sccm. Plasma etching takes place at an RF power of approximately 600 watts and a pressure of 500 miliTorr with an electrode gap of 1 cm. and an electrode temperature of 15° to 17° C. Although the preferred embodiment contemplates using a parallel plate plasma etcher, the particular plasma chemistry of the present invention can be used in other types of plasma etchers to obtain an anisotropic silicon etch profile.

Figure 5:
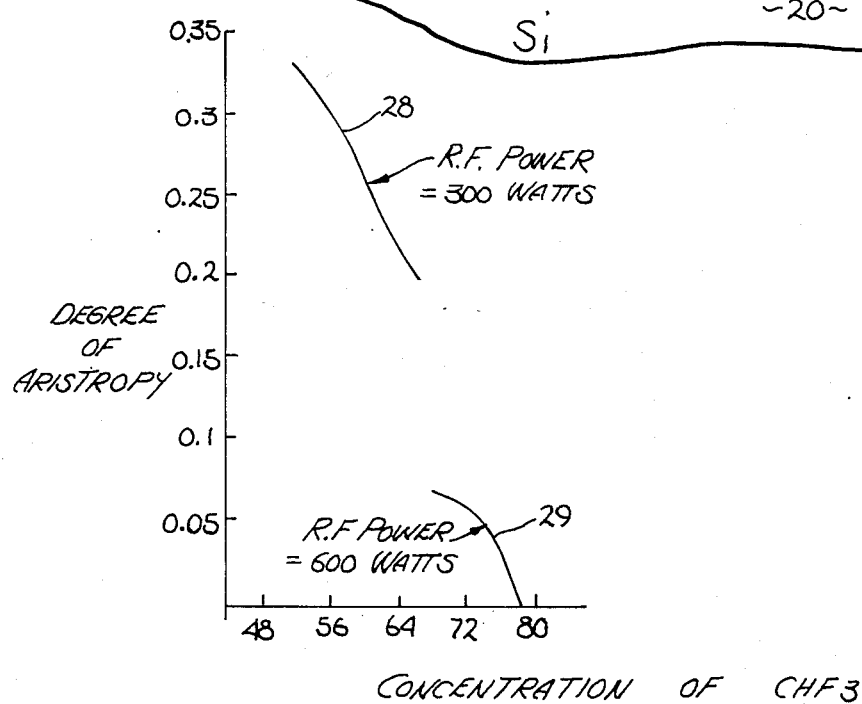
FIG. 5 is a graph showing degree of anisotropy plotted against concentration of $CHF_3$.

Additionally, the degree of anisotropy can be controlled by reducing the percentage of CHF3 in the CHF3/SF6 mixture. FIG. 5 illustrates a graph showing the degree of anisotropy versus the concentration of CHF3 for selected RF energies. The degree of anisotropy is expressed as the undercut of the photoresist divided by the depth of the etch. Curve 28 shows the relationship at an RF energy of 300 watts, from a concentration of 52% to 68% CHF. The range of anisotropy varies from approximately 0.34 to 0.2. Curve 29 illustrates the same relationship at an RF power of 600 watts and a concentration of CHF3 from 68% to 80%. At 68% the anisotropy is less than 0.1 and at higher concentrations it goes toward zero. Concentrations above 80% CHF3 are not efficient since the rate of etch will be slowed considerably. Some SF6 must be present for downward etching. In the preferred embodiment, 80% CHF3 is utilized.

Thus, a method of etching silicon using fluorinated gas mixtures has been described. The process used is non-toxic and non-corrosive, and results in anisotropic etching of silicon with no damage to the etched silicon surface.

I claim:

1. An improvement in the method of etching silicon semiconductor material with a plasma formed from a gas mixture, said improvement comprising:
    forming said plasma from a first amount of CHF3 in combination with a second amount of SF6, said first amount greater than said second amount;
    whereby an anisotropic etch is achieved.

2. The improvement as described by claim 1 wherein said first amount is approximately four times said second amount.

3. The improvement as described by claim 1 wherein said plasma is formed at an RF energy of approximately 600 watts.

4. An improved method for plasma etching of silicon semiconductor material comprising:
    forming a layer of photoresist on the surface of said silicon;
    defining openings in said photoresist to expose predetermined areas of said surface of said silicon;
    introducing a mixture of SF6 and CHF3 gas to said silicon;

applying electrical energy to said gas mixture to form a plasma;

etching said silicon with said plasma to a desired depth;

whereby said silicon is etched anisotropically.

5. The method as described by claim 4 wherein said gas mixture comprises approximately 80% CHF3 and approximately 20% SF6.

6. The method as defined by claim 4 wherein said electrical energy comprises approximately 600 watts.

7. The method as defined by claim 4 wherein said gas mixture is introduced to said silicon at a rate of approximately 125 sccm.

8. The method as described by claim 4 wherein the degree of said anisotropy is dependant on the percentage of CHF3 in said gas mixture combination.

* * * * *